United States Patent
Mao

(10) Patent No.: US 10,143,063 B2
(45) Date of Patent: Nov. 27, 2018

(54) ILLUMINATION LIGHT SOURCE AND FABRICATING METHOD THEREOF

(71) Applicant: BOE TECHNOLOGY GROUP CO., LTD., Beijing (CN)

(72) Inventor: Defeng Mao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/560,777

(22) PCT Filed: Oct. 10, 2016

(86) PCT No.: PCT/CN2016/101618
§ 371 (c)(1),
(2) Date: Sep. 22, 2017

(87) PCT Pub. No.: WO2018/068171
PCT Pub. Date: Apr. 19, 2018

(65) Prior Publication Data
US 2018/0255620 A1    Sep. 6, 2018

(51) Int. Cl.
*H05B 33/26* (2006.01)
*H01L 51/52* (2006.01)

(52) U.S. Cl.
CPC ......... *H05B 33/26* (2013.01); *H01L 51/5206* (2013.01); *H01L 51/5221* (2013.01)

(58) Field of Classification Search
CPC .............. H01L 51/5206; H01L 51/5221; H01L 2924/13061; H01L 2251/5361; H05B 33/26
See application file for complete search history.

(56) References Cited

U.S. PATENT DOCUMENTS

| 7,969,091 B2* | 6/2011 | Lin | H01J 65/046 313/346 R |
| 2007/0069235 A1* | 3/2007 | Ueno | H01J 11/00 257/109 |
| 2007/0164656 A1* | 7/2007 | Lin | H01J 63/04 313/497 |
| 2008/0211381 A1* | 9/2008 | Lin | H01J 65/046 313/495 |
| 2008/0220242 A1 | 9/2008 | Wei et al. | |

(Continued)

FOREIGN PATENT DOCUMENTS

| CN | 101192493 A | 6/2008 |
| CN | 101223627 A | 7/2008 |

(Continued)

OTHER PUBLICATIONS

International Search Report & Written Opinion dated Jun. 30, 2017 regarding PCT/CN2016/101618.

*Primary Examiner* — Anne Hines
(74) *Attorney, Agent, or Firm* — Intellectual Valley Law, P.C.

(57) ABSTRACT

The present application discloses an illumination light source including a base substrate; an anode layer on the base substrate; and a field emission illumination module having a carbon nanotubes layer on the base substrate; and a fluorescent powder layer on a side of the carbon nanotubes layer distal to the base substrate. The anode layer is on a side of the fluorescent powder layer distal to the carbon nanotubes layer.

20 Claims, 2 Drawing Sheets

(56) References Cited

U.S. PATENT DOCUMENTS

2009/0128002 A1    5/2009   Hu
2010/0072879 A1    3/2010   Fennimore et al.
2012/0248967 A1   10/2012   Li et al.

FOREIGN PATENT DOCUMENTS

| | | |
|---|---|---|
| CN | 101617384 A | 12/2009 |
| CN | 103972038 A | 8/2014 |
| WO | 2008103438 A1 | 8/2008 |

\* cited by examiner

ILLUMINATION LIGHT SOURCE AND FABRICATING METHOD THEREOF

CROSS-REFERENCE TO RELATED APPLICATION

This application is a national stage application under 35 U.S.C. § 371 of International Application No. PCT/CN2016/101618, filed Oct. 10, 2016, the contents of which are incorporated by reference in the entirety.

TECHNICAL FIELD

The present invention relates to display technology, more particularly, to an illumination light source and a fabricating method thereof.

BACKGROUND

Field emitting devices have become a focus of research and development in recent years. In a field emitting device, electrons are dissociated from a cathode by an electric field. The field emitted electrons are accelerated by a positive voltage of an anode, and collide with a light emitting material on the anode (e.g., a phosphorescent material) to emit light. Thus, in a field emitting device, the cathode is used as the field electron emitting source, the anode is used as the light emitting source, and the electrons emitted by the cathode substrate collide with the light emitting material on the anode to emit light.

SUMMARY

In one aspect, the present invention provides an illumination light source, comprising a base substrate; an anode layer on the base substrate; and a field emission illumination module comprising a carbon nanotubes layer on the base substrate; and a fluorescent powder layer on a side of the carbon nanotubes layer distal to the base substrate; wherein the anode layer is on a side of the fluorescent powder layer distal to the carbon nanotubes layer.

Optionally, the fluorescent powder layer comprises fluorescent powders of red, green, and blue colors.

Optionally, the illumination light source further comprises a light emitting diode illumination module; the light emitting diode illumination module comprising: a cathode layer between the base substrate and the anode layer, and a light emitting layer between the base substrate and the anode layer, the light emitting layer being on a side of the cathode layer distal to the base substrate; wherein the field emission illumination module and the light emitting diode illumination module being disposed horizontally in parallel with each other on the base substrate.

Optionally, the light emitting layer of the light emitting diode illumination module is a blue light emitting layer; and the field emission illumination module is a yellow light emitting field emission illumination module.

Optionally, the fluorescent powder layer comprises fluorescent powders of yellow color so that light emitted from the illumination light source is of substantially white color.

Optionally, the fluorescent powder layer comprises fluorescent powders of red and green colors so that light emitted from the illumination light source is of substantially white color.

Optionally, the fluorescent powder layer comprises fluorescent powders of red, green, and yellow colors so that light emitted from the illumination light source is of substantially white color.

Optionally, the cathode layer is configured to extend to a region between the base substrate and the carbon nanotubes layer.

Optionally, the light emitting diode illumination module is an organic light emitting diode illumination module, and the light emitting layer is an organic light emitting layer; the light emitting diode illumination module further comprising an electron transport layer on a side of the organic light emitting layer distal to the anode layer and proximal to the cathode layer, wherein the electron transport layer is made of a carbon nanotubes material.

Optionally, the electron transport layer and the carbon nanotubes layer are an integral layer.

Optionally, the anode layer is a transparent anode layer.

In another aspect, the present invention provides a method of fabricating an illumination light source comprising forming a carbon nanotubes layer on a base substrate; forming a fluorescent powder layer on a side of the carbon nanotubes layer distal to the base substrate; and forming an anode layer on a side of the fluorescent powder layer distal to the carbon nanotubes layer.

Optionally, the method further comprises forming a cathode layer on the base substrate; and forming a light emitting layer on a side of the cathode layer distal to the base substrate.

Optionally, the step of forming the cathode layer on the base substrate comprises forming a cathode material layer on the base substrate; and removing the cathode material layer in a region in which the fluorescent powder layer is to be formed.

Optionally, the step of forming the cathode layer on the base substrate comprises forming a material of the cathode layer on the base substrate.

Optionally, the step of forming the fluorescent powder layer comprises forming a carbon nanotubes solution layer on the base substrate; and heating the base substrate to remove a solvent in the carbon nanotubes solution layer thereby forming the carbon nanotubes layer.

Optionally, the method further comprises, subsequent to heating the base substrate to remove the solvent in the carbon nanotubes solution layer, removing the carbon nanotubes layer on a region in which the light emitting layer is to be formed.

Optionally, the cathode layer is formed to extend to a region between the base substrate and the carbon nanotubes layer.

Optionally, the light emitting layer is an organic light emitting layer; the method further comprising forming an electron transport layer on a side of the organic light emitting layer distal to the anode layer and proximal to the cathode layer; wherein the electron transport layer is formed by a carbon nanotubes material.

Optionally, the electron transport layer and the carbon nanotubes layer are formed as an integral layer in a single process using a same carbon nanotubes material.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Conventional light sources typically include a blue light emitting diode chip and a yellow fluorescent powder layer. The yellow fluorescent powder layer is irradiated by the blue light from the blue light emitting diode chip. Upon irradiation by the blue light, the yellow fluorescent powder layer emits yellow light, which is mixed with the blue light emitted from the blue light emitting diode chip. By mixing the yellow light and the blue light, a white light is achieved. Light emission efficiency, however, is relatively low in conventional light sources, in part, because a portion of the blue light is consumed in exciting the yellow fluorescent powders. Moreover, the excitation efficiency of the yellow fluorescent powders by the blue light decreases over time, resulting in a changed ratio between the blue light and the yellow light in the white light. The white light produced from conventional light sources typically has an increased color temperature and a decreased color gamut over its service life.

Accordingly, the present invention provides, inter alia, an illumination light source and a fabricating method thereof that substantially obviate one or more of the problems due to limitations and disadvantages of the related art. In one aspect, the present disclosure provides an illumination light source having a field emission illumination module including a base substrate; a carbon nanotubes layer on the base substrate; a fluorescent powder layer on a side of the carbon nanotubes layer distal to the base substrate; and an anode layer on a side of the fluorescent powder layer distal to the carbon nanotubes layer.

Figure 1:
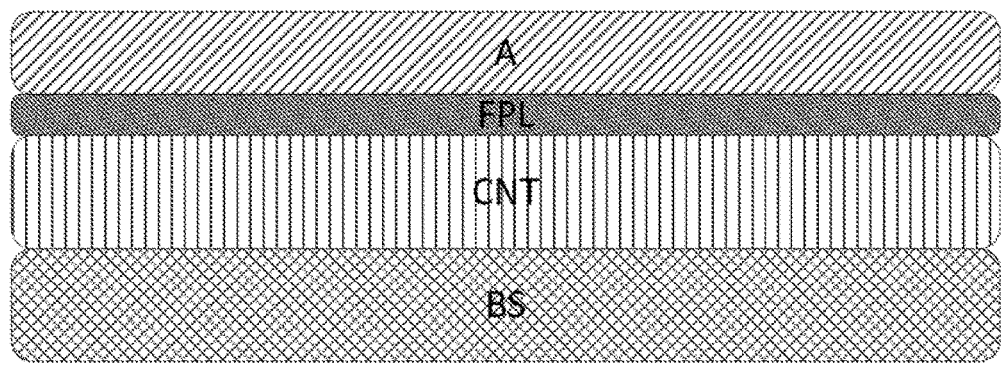
FIG. 1 is a diagram illustrating the structure of an illumination light source in some embodiments according to the present disclosure.

FIG. 1 is a diagram illustrating the structure of an illumination light source in some embodiments according to the present disclosure. Referring to FIG. 1, the illumination light source in the embodiment includes a field emission illumination module, which includes a base substrate BS, a carbon nanotubes layer CNT on the base substrate BS, a fluorescent powder layer FPL on a side of the carbon nanotubes layer CNT distal to the base substrate BS, and an anode layer A on a side of the fluorescent powder layer FPL distal to the carbon nanotubes layer CNT. Optionally, the anode layer A is a transparent anode layer. Optionally, the field emission illumination module is in a vacuum. Optionally, the carbon nanotubes layer CNT and the fluorescent powder layer FPL are spaced apart. Optionally, the carbon nanotubes layer CNT and the fluorescent powder layer FPL are in contact with each other.

The present field emission illumination module is used as an illumination light source. The light source of the present disclosure utilizes the field emission property of the carbon nanotubes layer CNT and the anode layer A to stimulate the fluorescent powders to emit light. The present light source may be manufactured with a low cost, a small thickness, and high brightness. The present light source produces low heat, has low energy consumption and a long service life, and is not subject to strict installation requirements or environment requirements. As such, the present light source may be used in a wide range of applications, e.g., as a back light for a large size display apparatus, street lights, and light sources for public spaces.

By including various fluorescent powders of different colors in the fluorescent powder layer FPL, the present light source may produce various light of colors suitable for different industrial needs. In some embodiments, the fluorescent powder layer FPL includes fluorescent powders of a single color, e.g., fluorescent powders of red color, fluorescent powders of green color, fluorescent powders of blue color, or fluorescent powders of yellow color. Optionally, the fluorescent powder layer FPL includes a mixture of fluorescent powders of different colors. For example, the fluorescent powder layer FPL may include a mixture of fluorescent powders of red, green, and blue colors for producing a white light source. Optionally, the fluorescent powder layer FPL includes a mixture of fluorescent powders of red and green colors. Optionally, the fluorescent powder layer FPL includes a mixture of fluorescent powders of red and blue colors. Optionally, the fluorescent powder layer FPL includes a mixture of fluorescent powders of blue and green colors.

In some embodiments, the present light source is a light source having a combination of a field emission illumination module and a light emitting diode illumination module. The field emission illumination module and the light emitting diode illumination module may be disposed in various different arrangements. Optionally, the field emission illumination module and the light emitting diode illumination module are vertically stacked on each other. Optionally, a projection of the field emission illumination module and a projection of the light emitting diode illumination module on the base substrate overlap with each other. Optionally, the field emission illumination module and the light emitting diode illumination module are parallelly stacked with each other. Optionally, a projection of the field emission illumination module and a projection of the light emitting diode illumination module on the base substrate do not overlap with each other. Optionally, the field emission illumination module and the light emitting diode illumination module are disposed horizontally in parallel with each other on the base substrate.

Figure 2:
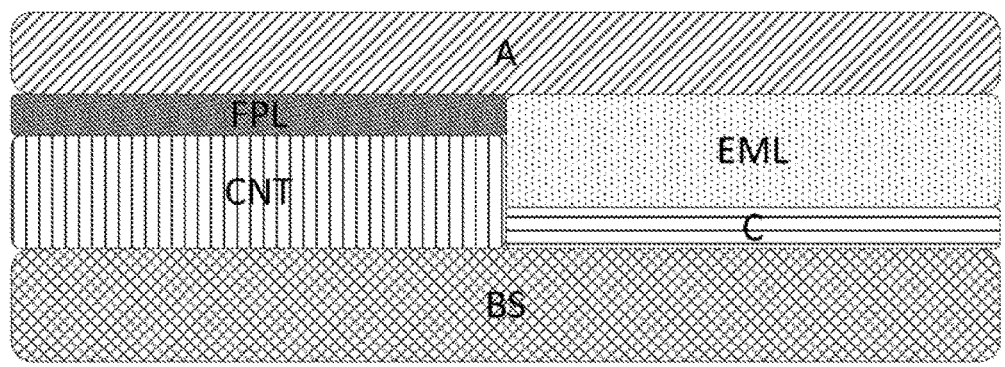
FIG. 2 is a diagram illustrating the structure of an illumination light source in some embodiments according to the present disclosure.

Various appropriate light emitting diodes may be used in the present light source. Optionally, the light emitting diode is an inorganic light emitting diode. Optionally, the light emitting diode is an organic light emitting diode. FIG. 2 is a diagram illustrating the structure of an illumination light source in some embodiments according to the present disclosure. Referring to FIG. 2, the light source in the embodiment includes a field emission illumination module on the left side and a light emitting diode illumination module on the right side. The light emitting diode illumination module includes a cathode layer C on the base substrate BS, a light emitting layer EML on a side of the cathode C distal to the base substrate BS, and the anode layer A on a side of the light emitting layer EML distal to the cathode C. The field emission illumination module includes a carbon nanotubes layer CNT on the base substrate BS, a fluorescent powder layer FPL on a side of the carbon nanotubes layer CNT distal to the base substrate BS, and an anode layer A on a side of the fluorescent powder layer FPL distal to the carbon nanotubes layer CNT. Optionally, the field emission illumination module and the light emitting diode illumination module commonly share an anode layer A, as illustrated in FIG. 2.

The light source according to the present disclosure has several unique advantages over the conventional light sources. For example, the fluorescent powders in the present light source is not irradiated by light from the light emitting diode illumination module. Instead, the fluorescent powders are stimulated by electrons from a carbon nanotubes layer. As a result, light from light emitting diode illumination module is not sacrificed in a process of irradiating fluorescent powders, resulting in a higher light emission efficiency. Because the fluorescent powders are stimulated directly by utilizing the field emission property of the carbon nanotubes layer and the anode layer, the light emission efficiency does not decrease over the service time of the light source. A truer color may be achieved in the light emitted by the present light source.

In some embodiments, light emitted from the light emitting diode illumination module and light emitted from the field emission illumination module are of different colors. Optionally, light emitted from the light emitting diode illumination module and light emitted from the field emission illumination module are of different colors so that a mixture of the two results in a substantially white color. Optionally, the light emitted from the light emitting diode illumination module is of a substantially blue color, and the light emitted from the field emission illumination module is of a substantially yellow color. Optionally, the fluorescent powder layer includes fluorescent powders of yellow color, and the light emitted from the light emitting diode illumination module is of a substantially blue color. Optionally, the fluorescent powder layer includes fluorescent powders of red and green colors, and the light emitted from the light emitting diode illumination module is of a substantially blue color, so that light emitted from the illumination light source is of substantially white color. Optionally, the fluorescent powder layer includes fluorescent powders of red, green, and yellow colors, and the light emitted from the light emitting diode illumination module is of a substantially blue color, so that light emitted from the illumination light source is of substantially white color.

Figure 3:
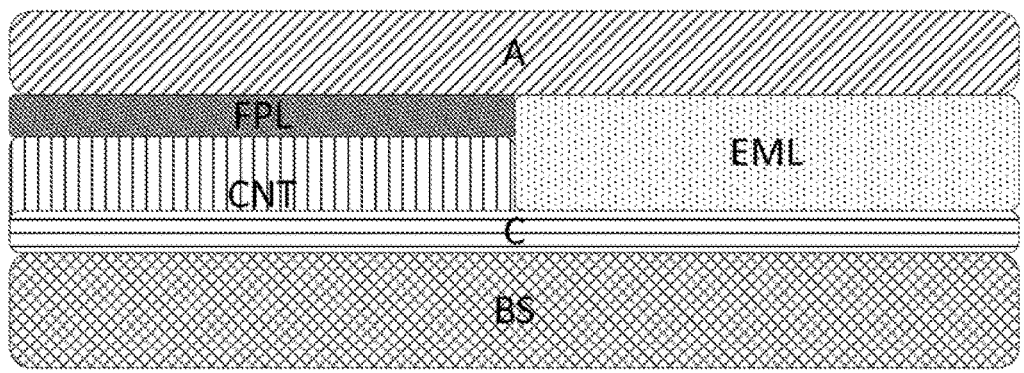
FIG. 3 is a diagram illustrating the structure of an illumination light source in some embodiments according to the present disclosure.

The light source may have various appropriate structures. In FIG. 2, the field emission illumination module utilizes the carbon nanotubes layer CNT as the cathode for driving the field emission illumination module. Optionally, the field emission illumination module may further include another cathode layer. FIG. 3 is a diagram illustrating the structure of an illumination light source in some embodiments according to the present disclosure. Referring to FIG. 3, both the field emission illumination module and the light emitting diode illumination module have a cathode layer C, which is an integral cathode layer C commonly shared by the field emission illumination module and the light emitting diode illumination module. In FIG. 3, the carbon nanotubes layer CNT in the field emission illumination module and the light emitting layer EML in the light emitting diode illumination module are on a side of the cathode layer C distal to the base substrate BS.

In some embodiments, the light emitting diode illumination module is an organic light emitting diode illumination module, and the light emitting layer is an organic light emitting layer. Optionally, the organic light emitting diode illumination module further includes an electron transport layer on a side of the organic light emitting layer distal to the anode layer and proximal to the cathode layer. Optionally, the organic light emitting diode illumination module further includes other organic functional layers, e.g., a hole transport layer on a side of the organic light emitting layer distal to the electron transport layer. It is discovered in the present disclosure that carbon nanotubes material has outstanding electron transport properties, thus is suitable for making electron transport layer in the present light source. Accordingly, in some embodiments, the electron transport layer in the organic light emitting diode illumination module is made of a carbon nanotubes material.

Figure 4:
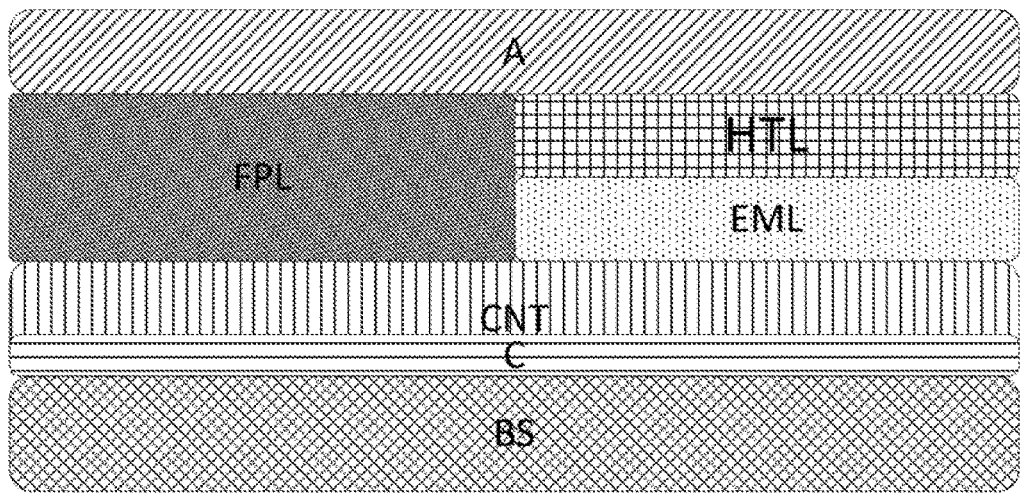
FIG. 4 is a diagram illustrating the structure of an illumination light source in some embodiments according to the present disclosure.

FIG. 4 is a diagram illustrating the structure of an illumination light source in some embodiments according to the present disclosure. Referring to FIG. 4, the organic light emitting diode illumination module includes a cathode layer C on the base substrate BS, a carbon nanotubes layer CNT (as the electron transport layer for the organic light emitting diode illumination module) on a side of the cathode layer C distal to the base substrate BS, an organic light emitting layer EML on a side of the carbon nanotubes layer CNT distal to the cathode layer C, a hole transport layer HTL on a side of the organic light emitting layer EML distal to the carbon nanotubes layer CNT, and an anode layer A on a side of the hole transport layer HTL distal to the organic light emitting layer EML. Optionally, the organic light emitting diode illumination module further includes other organic functional layers such as an electron injection layer between the cathode layer C and the carbon nanotubes layer CNT, and a hole injection layer between the anode layer A and the hole transport layer HTL. The field emission illumination module in FIG. 4 includes a carbon nanotubes layer CNT on the base substrate BS, a fluorescent powder layer FPL on a side of the carbon nanotubes layer CNT distal to the base substrate BS, and an anode layer A on a side of the fluorescent powder layer FPL distal to the carbon nanotubes layer CNT. Optionally, the field emission illumination module and the organic light emitting diode illumination module commonly share an anode layer A, as illustrated in FIG. 4.

In some embodiments, the carbon nanotubes layer CNT in the organic light emitting diode illumination module and the carbon nanotubes layer CNT in the field emission illumination module are an integral layer commonly shared by the field emission illumination module and the light emitting diode illumination module, as shown in FIG. 4. Optionally, the field emission illumination module and the light emitting diode illumination module commonly shared both a carbon nanotubes layer CNT and a cathode layer C. By having this design, the fabricating process of the present light source may be greatly simplified, resulting in a lower manufacturing cost.

In another aspect, the present disclosure provides a method of fabricating an illumination light source having a field emission illumination module. In some embodiments, the method includes forming a carbon nanotubes layer on a base substrate; forming a fluorescent powder layer on a side of the carbon nanotubes layer distal to the base substrate; and forming an anode layer on a side of the fluorescent powder layer distal to the carbon nanotubes layer.

Various appropriate methods may be used for forming the carbon nanotubes layer. Examples of appropriate methods for forming the carbon nanotubes layer include, but are not limited to, coating, sputtering, soaking, spin coating, and in-jet printing. Optionally, the carbon nanotubes layer may be formed by applying a carbon nanotubes solution on the base substrate, followed by heating the base substrate to remove the solvent in the carbon nanotubes solution.

Various appropriate methods may be used for forming the fluorescent powder layer. Examples of appropriate methods for forming the fluorescent powder layer include, but are not limited to, coating.

Various appropriate electrode materials and various appropriate fabricating methods may be used for forming the anode layer. Optionally, the anode layer is a transparent anode layer. Optionally, the anode layer may be formed using a transparent electrode material, e.g., indium tin oxide or nano-silver. Examples of appropriate methods for forming the anode layer include, but are not limited to, vapor deposition or sputtering.

In some embodiments, the fluorescent powder layer is formed using fluorescent powders of a single color, e.g., fluorescent powders of red color, fluorescent powders of green color, fluorescent powders of blue color, or fluorescent powders of yellow color. Optionally, the fluorescent powder layer is formed using a mixture of fluorescent powders of different colors. For example, the fluorescent powder layer may be formed using a mixture of fluorescent powders of red, green, and blue colors for producing a white light source. Optionally, the fluorescent powder layer is formed using a mixture of fluorescent powders of red and green colors. Optionally, the fluorescent powder layer is formed using a mixture of fluorescent powders of red and blue colors. Optionally, the fluorescent powder layer is formed using a mixture of fluorescent powders of blue and green colors.

In some embodiments, the fabricating method is a method of fabricating a light source having a combination of a field emission illumination module and a light emitting diode illumination module. Optionally, the field emission illumination module and the light emitting diode illumination module are formed to be vertically stacked on each other, e.g., a projection of the field emission illumination module and a projection of the light emitting diode illumination module on the base substrate overlap with each other. Optionally, the field emission illumination module and the light emitting diode illumination module are formed to be disposed parallelly to each other, e.g., a projection of the field emission illumination module and a projection of the light emitting diode illumination module on the base substrate do not overlap with each other. Optionally, the field emission illumination module and the light emitting diode illumination module are formed to be disposed horizontally in parallel with each other on the base substrate.

Accordingly, in some embodiments, the method includes a step of forming a light emitting diode illumination module and a step of forming a field emission illumination module. Optionally, the step of forming the light emitting diode illumination module includes forming a cathode layer on the base substrate; forming a light emitting layer on a side of the cathode layer distal to the base substrate; and forming the anode layer on a side of the light emitting layer distal to the cathode layer. Optionally, the field emission illumination module and the light emitting diode illumination module are formed horizontally in parallel with each other on the base substrate. Optionally, the step of forming the field emission illumination module includes forming a carbon nanotubes layer on the base substrate, forming a fluorescent powder layer on a side of the carbon nanotubes layer distal to the base substrate, and forming an anode layer on a side of the fluorescent powder layer distal to the carbon nanotubes layer.

Optionally, the field emission illumination module and the light emitting diode illumination module commonly share an integral anode layer. Optionally, the anode layer is a transparent anode layer. Optionally, the anode layer for the field emission illumination module and the anode layer for the light emitting diode illumination module are formed in a single process.

Optionally, the field emission illumination module and the light emitting diode illumination module commonly share an integral cathode layer. Optionally, the carbon nanotubes layer and the light emitting layer are formed on a side of the cathode layer distal to the base substrate. Optionally, the cathode layer for the field emission illumination module and the cathode layer for the light emitting diode illumination module are formed in a single process.

In some embodiments, the light emitting layer of the light emitting diode illumination module is a blue light emitting layer; and the field emission illumination module is a yellow light emitting field emission illumination module. Optionally, the fluorescent powder layer is formed by fluorescent powders of yellow color. Optionally, the fluorescent powder layer is formed by fluorescent powders of red and green colors, and the light emitting layer of the light emitting diode illumination module is a blue light emitting layer, so that light emitted from the illumination light source is of substantially white color. Optionally, the fluorescent powder layer is formed by fluorescent powders of red, green, and yellow colors, and the light emitting layer of the light emitting diode illumination module is a blue light emitting layer, so that light emitted from the illumination light source is of substantially white color.

In some embodiments, the light emitting diode illumination module is an organic light emitting diode illumination module, and the light emitting layer is an organic light emitting layer. Optionally, the step of forming the light emitting diode illumination module further includes forming an electron transport layer on a side of the organic light emitting layer distal to the anode layer and proximal to the cathode layer. Optionally, the electron transport layer is formed by a carbon nanotubes material. Optionally, the step of forming the light emitting diode illumination module further includes forming a hole transport layer on a side of the organic light emitting layer distal to the cathode layer and proximal to the anode layer.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An illumination light source, comprising:
a base substrate;
an anode layer on the base substrate; and
a field emission illumination module comprising:
    a carbon nanotubes layer on the base substrate; and
    a fluorescent powder layer on a side of the carbon nanotubes layer distal to the base substrate;
wherein the anode layer is on a side of the fluorescent powder layer distal to the carbon nanotubes layer.

2. The illumination light source of claim 1, wherein the fluorescent powder layer comprises fluorescent powders of red, green, and blue colors.

3. The illumination light source of claim 1, further comprising a light emitting diode illumination module; the light emitting diode illumination module comprising:
a cathode layer between the base substrate and the anode layer; and
a light emitting layer between the base substrate and the anode layer, the light emitting layer being on a side of the cathode layer distal to the base substrate;
wherein the field emission illumination module and the light emitting diode illumination module being disposed horizontally in parallel with each other on the base substrate.

4. The illumination light source of claim 3, wherein the light emitting layer of the light emitting diode illumination module is a blue light emitting layer; and the field emission illumination module is a yellow light emitting field emission illumination module.

5. The illumination light source of claim 4, wherein the fluorescent powder layer comprises fluorescent powders of yellow color so that light emitted from the illumination light source is of substantially white color.

6. The illumination light source of claim 4, wherein the fluorescent powder layer comprises fluorescent powders of red and green colors so that light emitted from the illumination light source is of substantially white color.

7. The illumination light source of claim 4, wherein the fluorescent powder layer comprises fluorescent powders of red, green, and yellow colors so that light emitted from the illumination light source is of substantially white color.

8. The illumination light source of claim 3, wherein the cathode layer is configured to extend to a region between the base substrate and the carbon nanotubes layer.

9. The illumination light source of claim 3, wherein the light emitting diode illumination module is an organic light emitting diode illumination module, and the light emitting layer is an organic light emitting layer; the light emitting diode illumination module further comprising:
an electron transport layer on a side of the organic light emitting layer distal to the anode layer and proximal to the cathode layer;
wherein the electron transport layer is made of a carbon nanotubes material.

10. The illumination light source of claim 9, wherein the electron transport layer and the carbon nanotubes layer are an integral layer.

11. The illumination light source of claim 1, wherein the anode layer is a transparent anode layer.

12. A method of fabricating an illumination light source, comprising:
forming a carbon nanotubes layer on a base substrate;
forming a fluorescent powder layer on a side of the carbon nanotubes layer distal to the base substrate; and
forming an anode layer on a side of the fluorescent powder layer distal to the carbon nanotubes layer.

13. The method of claim 12, further comprising:
forming a cathode layer on the base substrate; and
forming a light emitting layer on a side of the cathode layer distal to the base substrate.

14. The method of claim 13, wherein the step of forming the cathode layer on the base substrate comprises:
forming a cathode material layer on the base substrate; and
removing the cathode material layer in a region in which the fluorescent powder layer is to be formed.

15. The method of claim 13, wherein the step of forming the cathode layer on the base substrate comprises:
forming a material of the cathode layer on the base substrate.

16. The method of claim 15, wherein the step of forming the fluorescent powder layer comprises:
forming a carbon nanotubes solution layer on the base substrate; and
heating the base substrate to remove a solvent in the carbon nanotubes solution layer thereby forming the carbon nanotubes layer.

17. The method of claim 16, further comprising
subsequent to heating the base substrate to remove the solvent in the carbon nanotubes solution layer, removing the carbon nanotubes layer on a region in which the light emitting layer is to be formed.

18. The method of claim 13, wherein the cathode layer is formed to extend to a region between the base substrate and the carbon nanotubes layer.

19. The method of claim 13, wherein the light emitting layer is an organic light emitting layer; the method further comprising:
forming an electron transport layer on a side of the organic light emitting layer distal to the anode layer and proximal to the cathode layer;
wherein the electron transport layer is formed by a carbon nanotubes material.

20. The method of claim 19, wherein the electron transport layer and the carbon nanotubes layer are formed as an integral layer in a single process using a same carbon nanotubes material.

* * * * *